June 26, 1962 E. W. LEHMANN ET AL 3,041,547

VARIABLE FREQUENCY PHASE SHIFTER

Filed Oct. 17, 1958

EMIL W. LEHMANN
FRANCIS P. FINLON
INVENTORS

BY

V. C. Muller
ATTORNEYS

United States Patent Office 3,041,547

Patented June 26, 1962

3,041,547

VARIABLE FREQUENCY PHASE SHIFTER

Emil W. Lehmann, Princeton, N.J., and Francis P. Finlon, State College, Pa., assignors, by mesne assignments, to the United States of America as represented by the Secretary of the Navy

Filed Oct. 17, 1958, Ser. No. 768,002

1 Claim. (Cl. 331—45)

This invention relates to phase shifters for shifting the phase of an alternating voltage of any frequency without altering the amplitude thereof and has for its principal object the provision of a system for shifting the phase of an applied voltage without substantial variation in phase shift or amplitude in response to changes in the frequency of the input signal. Such a device finds many applications such as, for example, in producing a two-phase deflection voltage for scanning with a cathode ray tube and for producing two or more voltages in quadrature for test purposes and the like wherein it is necessary that the phase and amplitude thereof remain constant for different frequencies.

Figure 1:
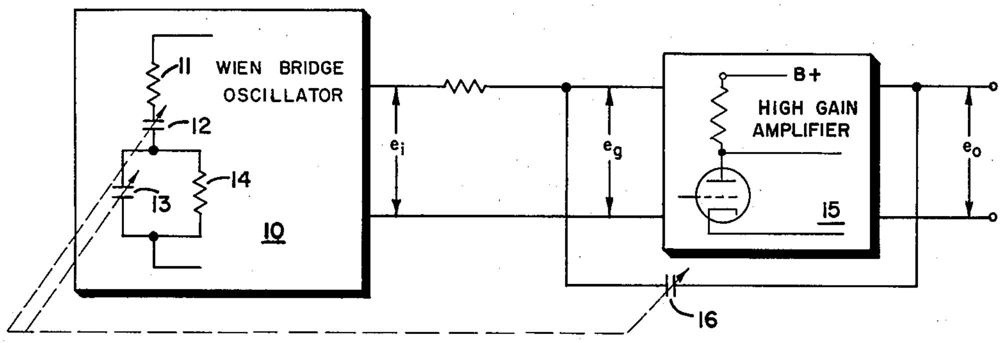
Figure 2:
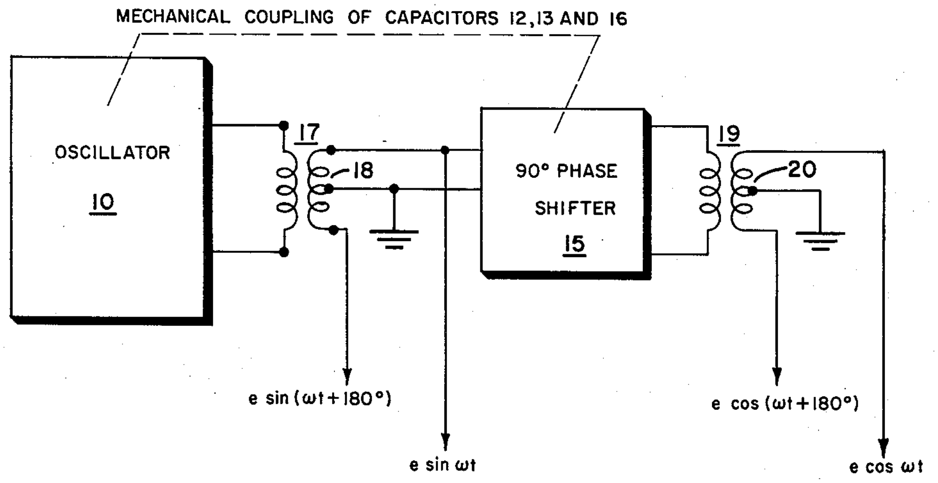

FIGURE 1 of the drawing is a block diagram of the invention for producing a variable frequency, constant amplitude, constant 90-degree phase shift, and FIGURE 2 is a block diagram of the invention similar to FIGURE 1 but modified to include two center-tapped transformers for producing four voltages at 0 degree, 90 degrees, 180 degrees, and 270 degrees, that are constant in phase relationship and amplitude for any change in frequency.

Briefly, the present invention contemplates a variable frequency generator of the Wien bridge type and an amplifier having a capacitor connected between the grid and plate wherein the capacitor in the amplifier is ganged to the variable capacitor or capacitors in the oscillator and is substantially identical therewith, whereby as the frequency of the oscillator is varied, the output signal of the amplifier will always be 90 degrees out of phase with the input signal to the amplifier and have a constant amplitude.

In FIGURE 1 and FIGURE 2, the numeral 10 indicates a variable frequency oscillator of the Wien bridge type. Such an oscillator has the characteristics:

$$f=\frac{1}{KRC}$$

where $f$ is frequency, R is resistance, C is variable capacitance, and K is a constant. For the frequency determining network comprised of a resistor 11 and a capacitor 12 in series with a capacitor 13 and a resistor 14 connected in parallel of a Wien bridge type oscillator shown for purposes of illustration at 10, $$f=\frac{1}{2\pi RC}=\frac{K_1}{C};\ C=\frac{K_1}{f}$$

The numeral 15 indicates a high-gain amplifier with a variable capacitor 16 connected between the grid and plate of a conventional vacuum tube 21. An analogous connection using solid-state amplifiers would be equally applicable. It is essential to the operation of this invention that capacitors 12—13 in the oscillator and capacitor 16 in the amplifier be ganged in any convenient manner and have the same capacitance-vs.-rotational characteristics. As shown in FIGURE 1, $e_i$ represents the output of the oscillator, $e_g$ the input to the amplifier, $e_o$ the output of the amplifier, and G the gain of the amplifier. For the circuitry as shown in FIGURE 1, the transfer function is:

$$\frac{e_o}{e_i}=-\frac{G}{1+j\omega RC(G+1)}=-\frac{1}{\frac{1}{G}+j\omega RC\frac{(G+1)}{G}}$$

For a high-gain amplifier where G»1:

$$\frac{e_o}{e_i}\cong\frac{1}{j\omega RC}=j\frac{1}{\omega RC}=j\frac{1}{2\pi fRC}$$

However, since:

$$C=\frac{K_1}{f},\ \frac{e_o}{e_i}=j\frac{1}{2\pi RK_1}=jK_2$$

From the above it follows that the output voltage $e_o$ of the amplifier is precisely 90 degrees out of phase with its input, that $e_o$ has a constant amplitude, and that the phase shift and amplitude of $e_o$ are entirely independent of frequency.

Another embodiment is shown in FIGURE 2 for producing four voltages at 0 degree, 90 degrees, 180 degrees, and 270 degrees wherein the amplitude and phase relationship of the four voltages are constant for any frequency.

Although four voltages in quadrature may be conventionally produced in a number of different ways, there is shown herein for purposes of illustration in FIGURE 2, an oscillator 10 connected to an output transformer 17 having its output winding 18 center-tapped and grounded. One half of the output winding is connected to the phase shifter 15 described hereinabove, the output of which is connected to another output transformer 19 which also has an output winding 20 center-tapped and grounded. It will be obvious that two voltages equal in amplitude and 180 degrees out of phase may be taken from the output winding 18 of transformer 17 and that two voltages equal in amplitude and substantially equal in amplitude to that of the input voltages and 90 degrees out of phase therewith may be taken from the output winding 20 of transformer 19. If there exists any difference in amplitude between the input voltage to the phase shifter 15 and its output voltage, such may be easily compensated for in transformer 19 in any conventional manner. Since the transfer constant of the phase shifter 15 is independent of frequency as pointed out hereinabove, the amplitude relationship between the input voltages (at 0 degree and 180 degrees) to the phase shifter and the output voltages (90 degrees and 270 degrees) of transformer 19 will always be the same. As pointed out hereinbefore, when the amplitude ratio of the voltages is not equal to 1, such may be compensated for in transformer 19. It may now also be obvious that when one has fixed two voltages continuously 90 degrees out of phase, of equal amplitude, and independent of frequency, substantially any phase relationship may be secured so long as the new phase shifters are similarly insensitive to frequency, or to state it another way, introduce no error in phase shift.

While the present invention has been described in its preferred embodiment, it is realized that modifications may be made, and it is desired that it be understood that no limitations on the invention are intended other than may be imposed by the scope of the appended claim.

Having now disclosed our invention, what we claim as new and desire to secure by Letters Patent of the United States is:

A frequency stabilized phase shifting circuit comprising in combination: a variable frequency voltage source comprising a Wien bridge oscillator having first and second variable capacitors for varying the said frequency; a high-gain amplifier having at least a control grid and an anode; a third variable capacitor connected between said control grid and said anode, said first, second and third capacitors having substantially identical capacitance-vs.- rotational characteristics; means connecting said capacitors whereby they may be simultaneously varied; a first transformer having a center-tapped output winding for supplying said variable frequency voltage to said amplifier, said amplifier being connected across one-half of said transformer output winding; and a second transformer having a center-tapped output winding for receiving the output signal of said amplifier.

References Cited in the file of this patent

UNITED STATES PATENTS

| | | |
|---|---|---|
| 2,577,235 | Davidson | Dec. 4, 1951 |
| 2,648,773 | Wallace | Aug. 11, 1953 |